United States Patent [19]

Kamieniecki et al.

[11] Patent Number: 5,661,408
[45] Date of Patent: Aug. 26, 1997

[54] REAL-TIME IN-LINE TESTING OF SEMICONDUCTOR WAFERS

[75] Inventors: Emil Kamieniecki, Lexington, Mass.; Jerzy Ruzyllo, State College, Pa.

[73] Assignee: QC Solutions, Inc., Woburn, Mass.

[21] Appl. No.: 396,694

[22] Filed: Mar. 1, 1995

[51] Int. Cl.$^6$ .......................... G01R 31/26; G01R 31/265
[52] U.S. Cl. ............................................ 324/765; 324/752
[58] Field of Search ................................... 324/765, 767, 324/768, 769, 752

[56] References Cited

U.S. PATENT DOCUMENTS

| | | | |
|---|---|---|---|
| 4,286,215 | 8/1981 | Miller | 324/765 |
| 4,333,051 | 6/1982 | Goodman | 324/752 |
| 4,433,288 | 2/1984 | Moore | 324/767 |
| 4,544,887 | 10/1985 | Kamieniecki | 324/752 |
| 4,663,526 | 5/1987 | Kamieniecki | 250/315.3 |
| 4,827,212 | 5/1989 | Kamieniecki | 324/765 |
| 4,891,584 | 1/1990 | Kamieniecki et al. | 324/752 |
| 5,025,145 | 6/1991 | Lagowski | 324/767 |
| 5,087,876 | 2/1992 | Reiss et al. | 324/765 |
| 5,091,691 | 2/1992 | Kamieniecki et al. | 324/765 |
| 5,177,351 | 1/1993 | Lagowski | 324/752 |

OTHER PUBLICATIONS

"Extended Abstracts", Fall Meeting, Oct. 9–14, 1984, vol. 83-2.

"Frequency Dependence of Photo–EMF of Strongly Inverted Ge and Si MIS Structures–II. Experiments", by R.S. Nakhmanson, et al., Solid–State Electronics, 1975, (month unavailable) Vo. 18, pp. 627–634.

"Frequency Dependence of the Photo–EMF of Stronly Inverted Ge and Si MIS Structures–I. Theory" by R.S. Nakhmanson Solid–State Electonics, 1975, (month unavailable) vol. 18, pp. 617–626.

"Ac Surface Photovoltages in Strongly–Inverted Oxidized p–Type Silicon Wafers", by C. Munakata, et al, Japanese Journal of Applied Physics, Nov., 1984, vol. 23, No. 11, pp. 1451–1461.

"Analysis of ac Surface Photovoltages in a Depleted Oxidized p–Type Silicon Wafer", by C. Munakata, et al. Japanese Journal of Applied Physics, Jun., 1986, vol. 25, No. 6, pp. 807–812.

"Non–Destructive Method of Observing Inhomogeneities in p–n Junctions with a Chopped Photon Beam", by C. Munakata, et al., Japanese Journal of Applied Physics, Feb., 1981, vol. 20, No. 2, pp. L137–L140.

"Determination of Surface Charge and Interface Trap Densities in Naturally Oxidized n–Type Si wafers Using ac Surface Photovoltages" by H. Shimizu, et al. Japanese Journal of Applied Physics, Feb. 1987, vol. 26, pp. 226–230.

"Analysis and Control of Electrically Active Contaminants by Surface Charge Analysis" by E. Kamieniecki, et al., Handbook of Semiconductor Wafer Cleaning Technology (date unknown).

"Non–Contact Mapping of Heavy Metal Contamination for Silicon ic Fabrication", by J. Lagowski, et al., Semicond. Sci. Technology, 1992 (month unavailable).

"Determination of Surface Space Charge Capacitance Using a Light Probe", by E. Kamieniecki, J. Vac. Sci. Technology, Mar. 1982.

"A New Method for In–Line, Real–Time Monitoring of Wafer Cleaning Operations", by E. Kamieniecki, et al., Presented during the Symposium on Ultra Cleaning Processing of Silicon Surfaces, Sep. 9–21, 1994.

(List continued on next page.)

*Primary Examiner*—Ernest F. Karlsen
*Attorney, Agent, or Firm*—Testa, Hurwitz & Thibeault, LLP

[57] ABSTRACT

An apparatus and method for the real-time, in-line testing of semiconductor wafers during the manufacturing process. In one embodiment the apparatus includes a probe assembly within a semiconductor wafer processing line. As each wafer passes adjacent the probe assembly, a source of modulated light, within the probe assembly, having a predetermined wavelength and frequency of modulation, impinges upon the wafer. A sensor in the probe assembly measures the surface photovoltage induced by the modulated light. A computer then uses the induced surface photovoltage to determine various electrical characteristics of the wafer.

39 Claims, 7 Drawing Sheets

OTHER PUBLICATIONS

"Surface Photovoltage Measured Capacitance: Application to Semiconductor/Electrolyte System" by E. Kamieniecki, J. Appl. Phys., Nov. 1983.

AN–1 Application Note—Surface Charge Profiler, "Performance Demonstration", QC Solutions, Inc., Jul. 1994.

AN–2 Application Note—Surface Charge Profiler, "In Wafer Cleaning Monitoring", QC Solutions, Inc., Sep. 1994.

AN–3 Application Note—Surface Charge Profiler, "Monitoring of Wafer Cleansing Using the Surface Charge Profiler on the Back Surfaces of the Wafer", Nov. 1994.

"Surface Charge Profiler" brochure mailed out by QC Solutions, Inc. in Jan. 1995.

"Surface Charge Analysis: A New method to . . . Oxide System", by E. Kamieniecki, Semiconductor Cleaning Technology/ 1989 Electronics and Dielectrics and Insulation Divisions (month unavailable).

REAL-TIME IN-LINE TESTING OF SEMICONDUCTOR WAFERS

FIELD OF THE INVENTION

The invention relates to the testing of semiconductor wafers during manufacturing and specifically to the real-time in-line testing of semiconductor wafers during integrated circuit fabrication.

BACKGROUND OF THE INVENTION

There are numerous individual operations, or processing steps, performed, in a strictly followed sequence, on the silicon wafer in the course of manufacturing a complex integrated circuit (IC). Each such operation must be precisely controlled in order to assure that the entire fabrication process yields integrated circuits displaying the required electrical characteristics.

Frequently, failure of an individual operation is detected only after the completion of the entire, very expensive, process of IC fabrication. Due to the very high cost of advanced IC fabrication processes, such failures result in the severe financial losses to the integrated circuit manufacturer. Therefore detection of errors in the manufacturing process, immediately after their occurrence, could prevent the unnecessary continuation of the fabrication of devices which are destined to malfunction, and hence, could substantially reduce the financial losses resulting from such errors.

Process monitoring in semiconductor device manufacturing relies upon the examination of the changes which occur in certain physical and/or chemical properties of the silicon wafer upon which the semiconductor devices are fabricated. These changes may occur following the various processing steps to silicon wafer is subjected and are reflected by changes in the electrical properties of the wafer. Therefore, by monitoring selected electrical properties of the silicon wafer in the course of IC fabrication, an effective control over the manufacturing process can be accomplished.

Not all of the electrical characteristics of a completed integrated circuit can be predicted based on the measurements performed on a partially processed wafer. Most of the characteristics however, can be predicted directly or indirectly based on the investigation of the condition of the surface of the silicon wafer (substrate) in the course of IC manufacture. The condition of the silicon surface is very sensitive to the outcome of the individual processing steps which are applied during IC manufacturing, and hence, the measurement of the electrical properties of the substrate surface can be an effective tool by which the monitoring of the outcome of the individual processing steps can be accomplished.

The determination of the electrical characteristics of the wafer surface typically requires physical contact with the wafer surface, or the placement of a contactless probe over a stationary wafer. In the latter case an optical signal or a high electric field is used to disturb equilibrium distribution of the electrons in the surface and near-surface region of semiconductor. Typically, the degree of departure from equilibrium is driven by variations of one or more electrical characteristics of the surface region, the near-surface region, and the bulk of the semiconductor. To obtain a more complete picture of the entire surface of the wafer, several measurements at various points on the surface can be made. Such a procedure, known as "mapping", moves the measuring probe with respect to the measured material (or vice versa) over the surface of specimen, stopping at a number of locations and performing a measurement at each location before moving to the next location. The substrate, in this procedure, does not remain in the continuous motion, so consequently the applicability of such a method for use in real-time in-line process monitoring is limited.

SUMMARY OF THE INVENTION

The invention relates to an apparatus and method for the real-time, in-line monitoring of semiconductor wafer processing. In one embodiment the apparatus includes a probe assembly located within a semiconductor wafer processing line. As each wafer is carried beneath or above the probe assembly by conveyor belt, robotic arm, wafer chuck, or other similar device, a source of modulated light, such as an LED, within the probe assembly, generates light having a predetermined wavelength and frequency of modulation which then impinges upon the wafer. A sensor in the probe assembly measures the surface photovoltage induced by the modulated light. The signal from the sensor is sent to a computer which then uses the induced surface photovoltage to determine various electrical characteristics of the wafer, such as surface charge and surface doping concentration, among others.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DESCRIPTION OF THE PREFERRED EMBODIMENT

Figure 1:
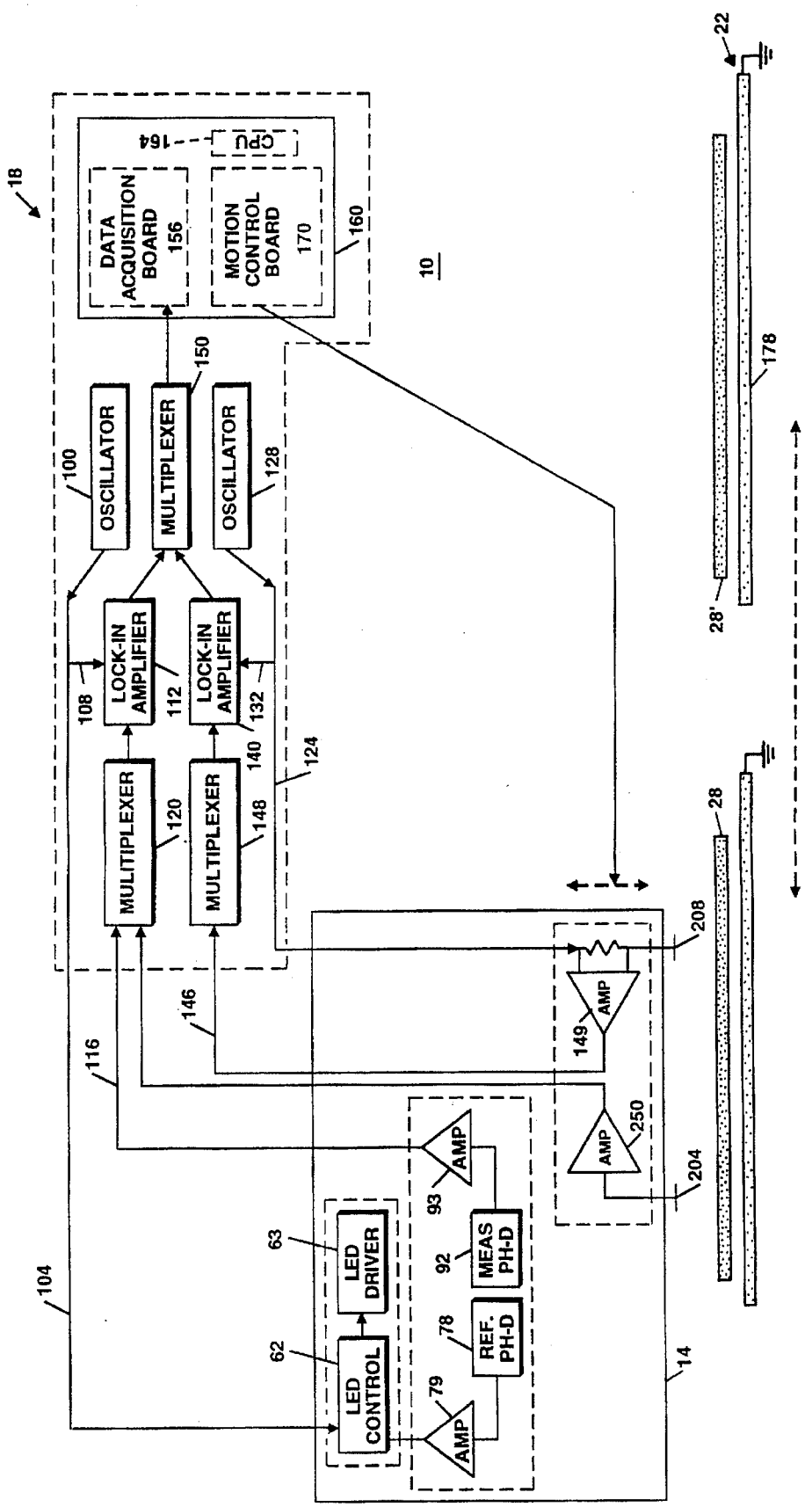
FIG. 1 is a block diagram of an embodiment of an apparatus for the real-time, in-line, electrical characterization of a semiconductor during manufacturing.

In one embodiment, the apparatus to perform various electrical characterizations makes use of the method for measuring the photo-induced voltage at the surface of semiconductor materials, termed the surface photovoltage (SPV), disclosed in the U.S. Pat. No. 4,544,887. In this method, a beam of light is directed at a region of the surface of a specimen of semiconductor material and the photo-induced change in electrical potential at the surface is measured. The wavelength of the illuminating light beam is selected to be shorter than the wavelength of light corresponding to the energy gap of the semiconductor material under going testing. The intensity of the light beam is modulated, with both the intensity of the light and the frequency of modulation being selected such that the resulting AC component of the induced photovoltage is directly proportional to the intensity of light and inversely proportional to the frequency of modulation.

When measured under these conditions, the AC component of the surface photovoltage (SPV), designated $\delta V_S$, is proportional to the reciprocal of the semiconductor space-charge capacitance, $C_{SC}$. When the surface of the specimen is illuminated uniformly, the relationship between the surface photovoltage (SPV) and the space-charge capacitance is given, at sufficiently high frequencies of light modulation, by the relation:

$$\delta V_s = \frac{\phi(1-R)}{Kf} \, qC_{SC}^{-1}$$

where $\Phi$ is the incident photon flux, R is the reflection coefficient of the semiconductor specimen, f is the frequency at which the light is modulated, and q is the elementary charge. The constant K is equal to 4 for a square wave modulation of the light intensity and is equal to $2\pi$ for sinusoidal modulation.

In the above referenced patent, only a uniform configuration is considered in which the area of the sensor is at least the same size as the semiconductor wafer and the entire area of the specimen is uniformly illuminated. When only a portion of the semiconductor specimen surface is coupled to the sensor, that is, when the sensor is smaller than the wafer, and when the semiconductor surface uniformly illuminated in that area is coupled to the sensor, the surface photovoltage, $\delta V_S$, may be determined from the measured signal, $\delta V_m$, according to the relationships:

$$Re(\delta V_s) = Re(\delta V_m) \cdot (1 + C_L/C_P) + Im(\delta V_m) \cdot (\omega \cdot C_P \cdot R_L)^{-1}$$

$$Im(\delta V_s) = Im(\delta V_m) \cdot (1 + C_L/C_P) - Re(\delta V_m) \cdot (\omega \cdot C_P \cdot R_L)^{-1}$$

where $Re(\delta V_S)$ and $Im(\delta V)$ are the real and imaginary components of the voltage, $\omega$ is an angular frequency of light modulation, $C_P$ is the capacitance between sensor and the wafer, and $C_L$ and $R_L$ are the input capacitance and resistance, respectively, of the electronic detection system.

From the sign of the imaginary component, the conductivity type may be determined. If the measurement is calibrated for a p-type material, then the sign of the imaginary component will change if the material is n-type.

Using above relationships, the depletion layer width, $W_d$, is given by equation:

$$W_d = \frac{\epsilon}{q} \, \frac{\omega |Im(\delta V_s)|}{\phi(1-R)} \cdot \left(1 + \left[\frac{Re(\delta V_s)}{Im(\delta V_s)}\right]^2\right)$$

where $\phi(1-R)$ is the intensity of light absorbed in the semiconductor, q is the elementary charge, and $\epsilon_S$ is the semiconductor permittivity.

In addition to the space-charge capacitance, $C_{SC}$, the measurement of the surface photovoltage can be used to determine the surface charge density, $Q_{SS}$, the doping concentration, $N_{SC}$, and the surface recombination lifetime, $\tau$, using the following relationships. The space charge capacitance, $C_{SC}$, is proportional to the reciprocal of the semiconductor depletion layer width, $W_d$, according to the relationship:

$$C_{sc} = \frac{\epsilon_s}{W_d}$$

where $\epsilon_S$ is the semiconductor permittivity. The density of space charge, $Q_{SC}$, is in turn described by equation:

$$Q_{sc} = q \, N_{sc} W_d$$

where q is an elementary charge and the net doping concentration in the space-charge region, $N_{SC}$, is positive in an n-type material and negative in a p-type material. In addition, since the surface charge density, $Q_{SS}$, is given by the expression:

$$Q_{sc} = -Q_{ss}$$

the surface charge density is easily determined from the space charge density.

Further, if an inversion layer can be created at the wafer surface, the depletion layer width, $W_d$, under inversion conditions is related to the net doping concentration, $N_{SC}$, according to the relationship:

$$W_d = \sqrt{\frac{4\epsilon_s kT \ln(|N_{sc}|/n_i)}{q^2 |N_{sc}|}}$$

where kT is the thermal energy and $n_i$ is the intrinsic concentration of free carriers in the semiconductor. Several methods of forming such an inversion layer at the semiconductor surface are disclosed below.

Finally, the surface recombination rate may also be determined from the SPV. The recombination lifetime of the minority carriers at the surface, $\tau$, is given by the expression:

$$\frac{1}{\omega\tau} = \left|\frac{Re(\delta V_s)}{Im(\delta V_s)}\right|$$

In brief overview, and referring to FIG. 1, an embodiment of such an apparatus 10 for the real-time, in-line, electrical characterization of a semiconductor during manufacturing using induced surface photovoltage includes a sensor probe assembly 14, supporting electronics 18, and a wafer conveying device 22. In operation, the wafer conveying device 22, such as a conveyor belt, a robotic arm, a wafer chuck or similar device, moves wafers 28, 28' through the manufacturing process and, in one embodiment, beneath the sensor head assembly 14.

Figure 2:
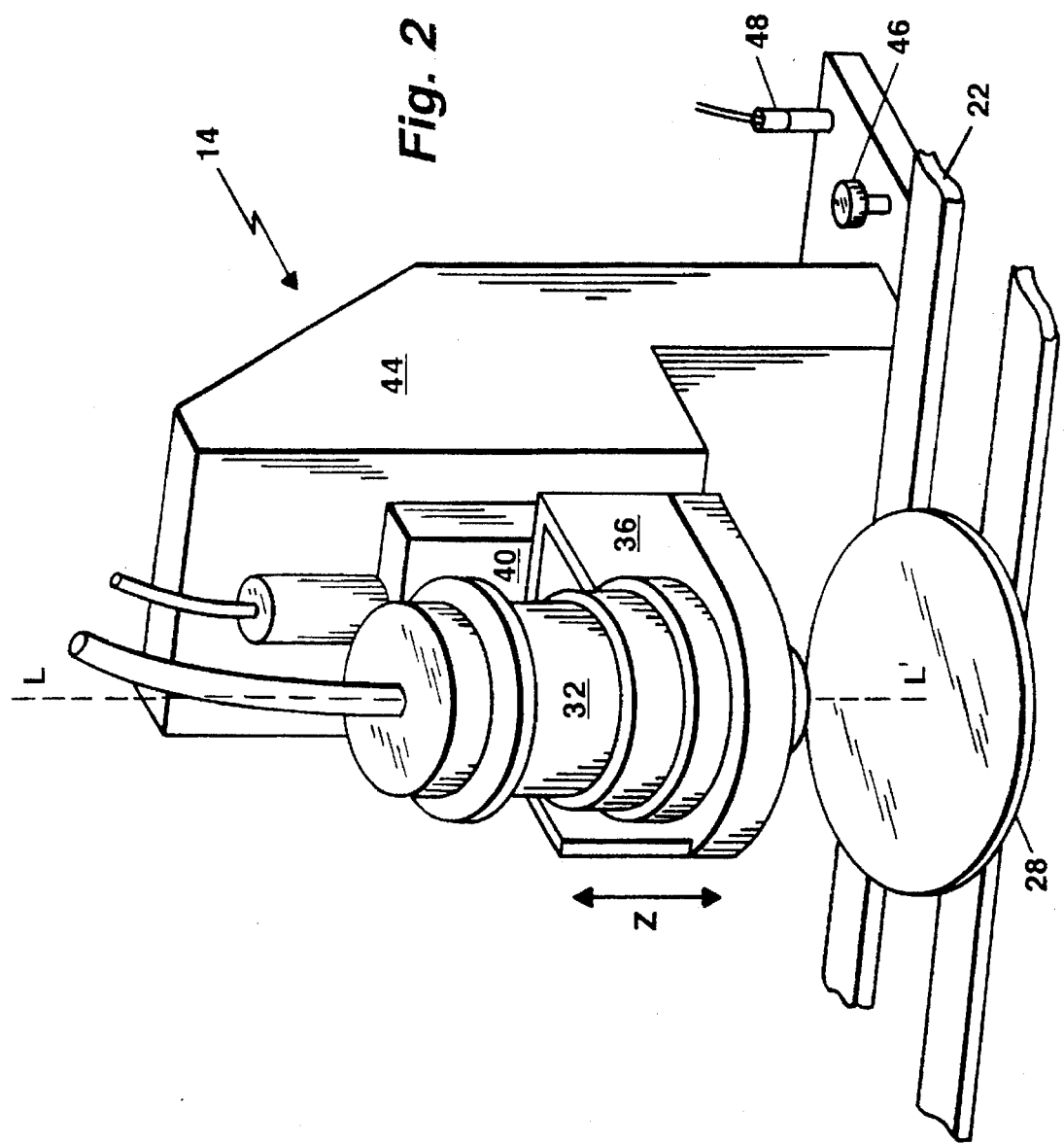
FIG. 2 is a perspective view of an embodiment of the probe assembly of the apparatus of FIG. 1 in position above a wafer transfer system.

Referring to FIG. 2, the sensor probe head assembly 14 includes a probe head 32 mounted in a bracket 36 on a motorized stage 40. The motorized stage 40 moves the probe head 32 in a vertical direction (arrow z) to adjust vertical position of the probe head 32 with respect to the wafer 28 to within a 0.2 μm accuracy. The mechanical stage 40 is attached to a probe arm 44.

The longitudinal axis L–L' of the probe head 32 is adjusted to be perpendicular to the plane of the wafer 28, by adjusting the tilt of the probe arm 44, either manually (using set screws 46) or mechanically (using for example piezoelectric actuators 48). The vertical position of the probe head 32 with respect to the wafer 28 is controlled by feedback signal from capacitive-position sensing electrodes described in detail below.

Briefly, three capacitive-position sensing electrodes are located on the periphery of the sensor. To measure capacitance between each of these electrodes and the wafer, a 70 kHz 1 V signal is applied through a respective 10 kohm resistor connected to each of these electrodes. The AC current flowing through these resistors in measured using a preamplifier and a lock-in amplifier. The lock-in signal is further processed by a computer and supplied to the motion control board that, in turn, positions the probe at a predetermined distance from the wafer surface using vertical (z-axis) motorized stage.

Figure 3:
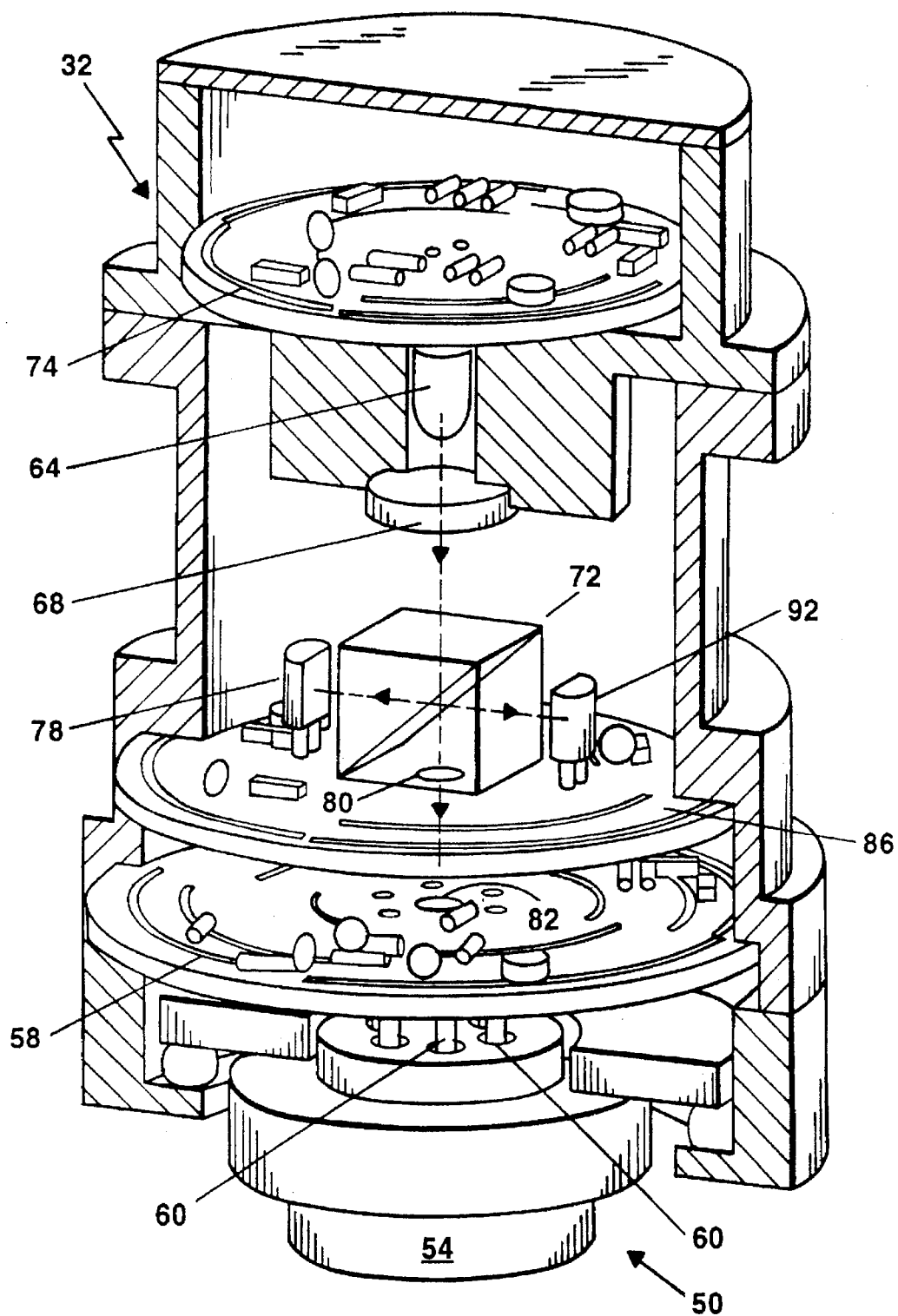
FIG. 3 is a top perspective cutaway view of the probe assembly of FIG.2.

Referring to FIG. 3, the probe head 32 includes a sensor mount assembly 50 which provides support for a sensor 54 that is connected to a preamplifier board 58 by a plurality of flexible connectors 60. Light emitted by a light emitting diode (LED) 64 is collimated by lens 68 prior to passing through a beam splitter 72.

LED 64 is mounted on a LED driver board 74 which controls the intensity of the LED 64, in response to a signal from a reference photodiode 78, (through a preamplifier 79) at an intensity level determined by the computer 160. Light from the LED 64 reaches the reference photodiode 78 by being partially reflected by the beam splitter 72. The light which passes through the beam splitter 72 passes through openings 80, 82 in the circuit board 86 and the preamplifier board 58, respectively, prior to passing through the sensor mount assembly 50 and impinging on the wafer 28 undergoing testing.

Light reflected by the wafer 28 passes back along the light path just described before being reflected by the beam splitter 72 to a measuring photodiode 92. The light reflected by the wafer 28, $\Phi_R$, is used to detect edge of the wafer passing beneath the probe head 32 and trigger measurements. The reflected light is also used to measure light absorbed in the wafer 28 according to the relationship:

$$\Phi = \Phi_0 - \Phi hd\, R$$

where $\Phi_0$ is the incident light which can be determined by measuring the light reflected from an aluminum mirror replacing the wafer 28. In this way, the reflection coefficient of the wafer 28 can be determined. Although the above embodiment describes the splitting of light by a beam splitter, other embodiments are possible in which light is split using optical fibers.

Referring again to FIG. 1, the LED 64 is controlled by signals from, and the probe head 32 returns signals to, supporting electronics 18. The supporting electronics 18 include an oscillator 100 which supplies a 40 kHz modulation control signal 104 that is used as a reference signal by an LED control 62 to control an LED driver 63 which powers the LED 64. Oscillator 100 also provides a reference signal 108 to a lock-in amplifier 112. The output signals 116 from the surface photovoltage sensor and the measurement photodiode 92 (through a preamplifier 93) of the probe head 32 are input signals to multiplexer 120 that alternately connects each signal to the input of the lock-in amplifier 112. The lock-in amplifier 112 demodulates the input signal and supplies the demodulated signal to another multiplexer 150. Multiplexer 150 switches between the two input signals from lock-in amplifiers 112 and 140 connecting them to a data acquisition (DAQ) board 156 that in turn digitizes the input signals making them available for further processing in the computer 160. In an alternate embodiment, multiplexer 150 is part of the data acquisition board 156.

Figure 4:
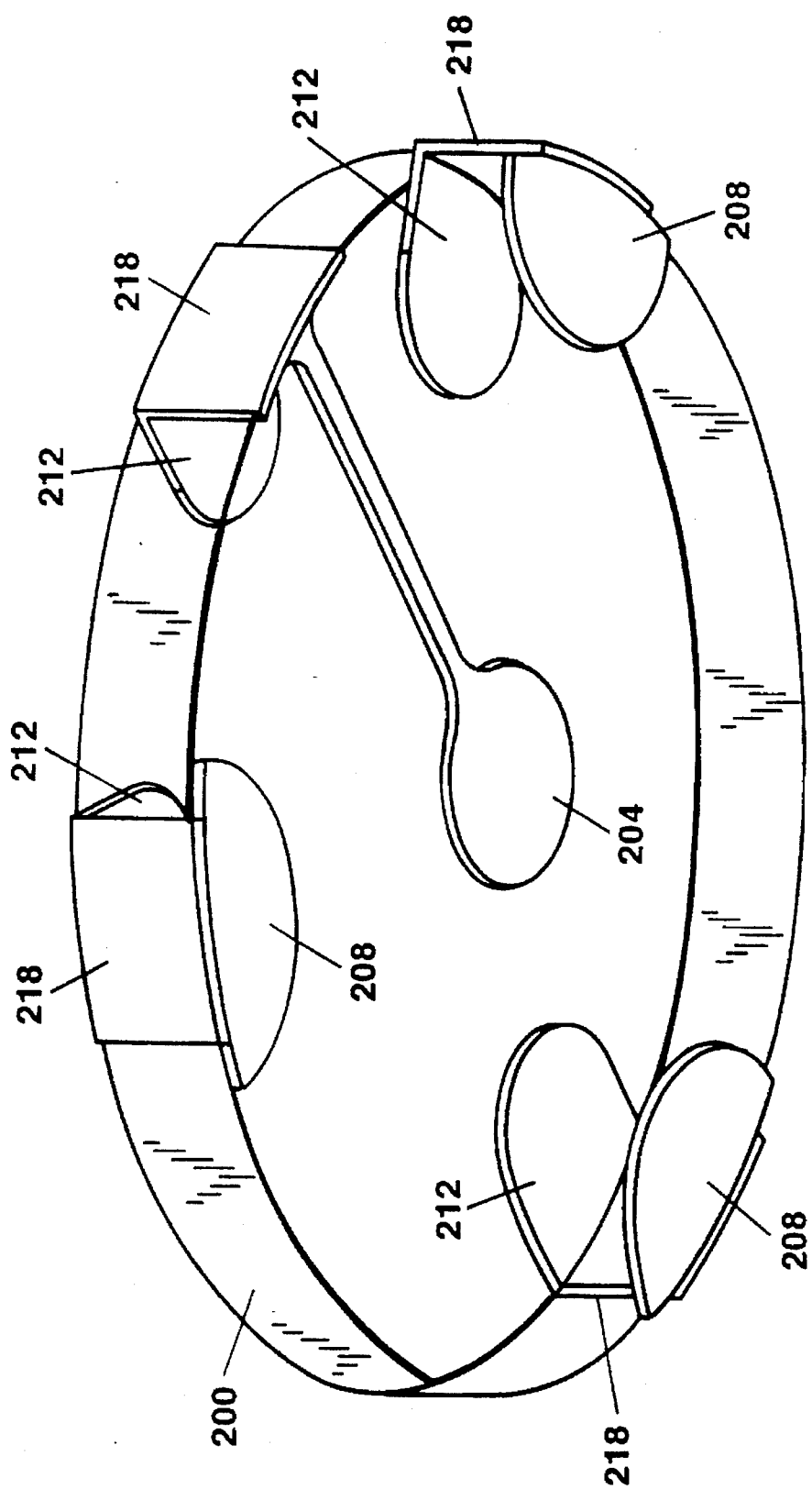
FIG. 4 is a bottom perspective view of an embodiment of the sensor plate of the probe assembly of FIG. 3.

FIG. 4 is a bottom perspective view showing the sensor plate of the sensor head 32. A plurality of electrodes are formed on a rigid and insulating substrate 200. In one embodiment, a 10 mm diameter fused quartz disc is used. A central surface photovoltage electrode 204 detects the signal from the wafer 28. The central surface photovoltage electrode 204 is partially transmissive, thereby permitting the light from the LED 64 to reach the wafer 28. Three other electrodes 208 located on the periphery of the substrate are used both for sensing the position of the sensor head 32 above the wafer 28 and for measuring the parallelism of the sensor with respect to the surface of the wafer 28. All electrodes 204, 208 are formed by the deposition of an indium-tinoxide film through a shadow mask.

Similarly, a plurality of electrodes 212, for connecting the sensors with the preamplifier circuit board 58 through the flexible connectors 60, are formed on the surface of the substrate 200 which is opposite the electrodes 204, 208. Thin conductive electrodes 218, on the side walls of the substrate 200, which connect the electrodes 204, 208 on the first surface with their respective electrodes 212 on the second surface, are also deposited using a shadow mask. This deposition avoids the use of vias through the substrate and thereby retains the flatness of the sensor to better than 0.2 µm. Both front 204, 208 and side electrodes 218, may be protected with a thin insulating coating, such as polyimide, formed by spinning so as to maintain the flatness of the sensor.

The electrodes 208 are used for capacitively sensing the position of the sensor above the wafer 28. Referring again to FIG. 1, a 70 kHz input signal 124 for measuring the distance from a wafer 28 is supplied by an oscillator 128 to the position electrodes 208. The same signal is also supplied as a reference signal 132 for a lock-in amplifier 140. A position signal 146 from each of the three position sensing electrodes 208 is supplied as the input signal to a multiplexer 148 through a preamplifier 149. The multiplexer 148 in turn, switching between each of these signals, connects each alternately to a lock-in amplifier 140. The demodulated output signals from the lock-in amplifiers 112 and 140 are input signals to a multiplexer 150 which connects each signal alternately to a data acquisition board 156 located in a computer 160, including a CPU 164. Again, in an alternative embodiment, multiplexer 150 is part of the data acquisition board 156.

The position signal 146 is compared by the CPU 164 with the reference value corresponding to a desired distance (established by calibration and stored in the computer) between the sensor 54 and the wafer 28. The difference between these two values, corresponds to the deviation of the sensor-wafer distance from the desired value, is supplied to a motion control board 170 that positions the probe head 32 at a predetermined distance from the wafer 28 using the motorized stage 40.

In operation, when an edge of the continuously moving wafer 28 crosses the beam of the intensity modulated light from LED 64, the intensity of the reflected light increases, thereby increasing the signal from the photodiode 92. This measurement of the reflected light is repeated and the new value compared with the previous value. The light intensity measurements are repeated until the difference between sequential Values decreases to below 5% indicating that the entire light beam is within the flat portion of the wafer.

This decrease in deviation triggers acquisition of the SPV signal by the surface photovoltage electrode 204, followed by acquisition of the capacitance signals by the position electrodes 208. If capacitance signals from different electrodes (208) differ by more than 5%, the SPV signal is stored but not recalculated. The sequence of all measurements is then repeated until capacitances from different position electrodes (208) fall within 5% limit indicating that the electrodes are not near the edge of the wafer 28. The average of the capacitances from the three positioning electrodes 208 at this point is used to recalculate all previous values of the SPV signal.

The SPV measurement cycle is repeated, sequentially measuring light intensity, SPV signal and capacitance of positioning electrodes, until capacitances from the three positioning electrodes (208) differ by more than 5%, indicating the approach of the opposite edge of the wafer 28. After reaching this point of the wafer 28, the SPV measurements are made using the previously measured values of capacitance. The measurements of each value (reflected light, SPV signal, capacitance), in each cycle, are repeated for 10 msec and averaged by CPU 164.

Figure 5:
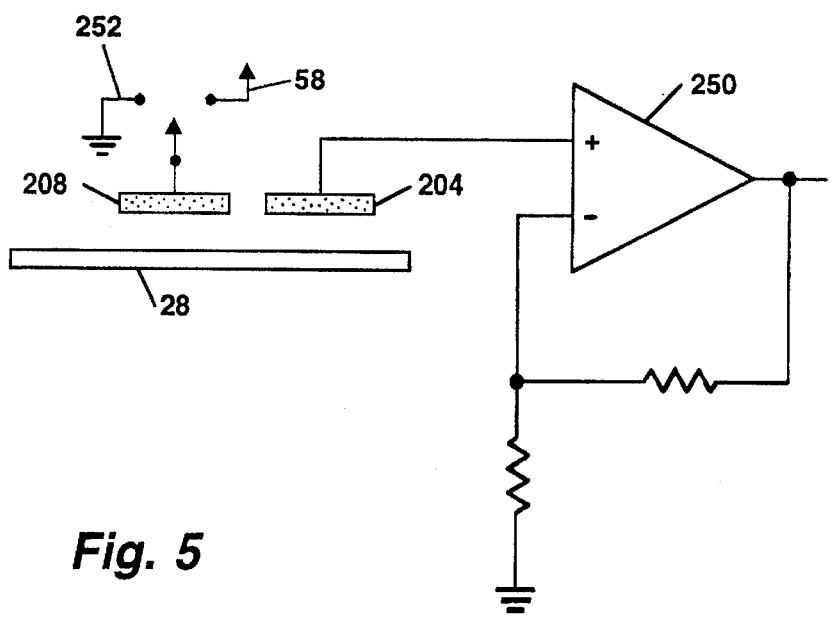
FIG. 5 is a schematic diagram of an embodiment of an electrical circuit for measuring the surface photovoltage using front wafer surface coupling.

The wafer 28, in one embodiment, is placed on the grounded chuck (conveyor belt, robotic arm, or other similar device) 178, coated with an insulating material, that is used to carry the wafer 28 beneath, above, or otherwise, such that the surface of the sensor of the probe head 32 and the surface of the wafer are parallel. Alternatively, the conveying device may be biased by a DC voltage. In one embodiment the DC bias voltage is selected to be between −1000 and 1000 volts. Although FIG. 1 illustrates the use of a grounded, insulated chuck 22 to move the wafer 28 beneath the probe assembly 14, it is possible to provide all the necessary measurements without grounding the chuck using only the electrodes provided by the sensor 54. Referring to FIG. 5, the SPV signal is, as described previously, received by the central surface photovoltage electrode 204 which is connected to the input terminal of an operational amplifier 250 located on the preamplifier circuit board 58. The other input terminal of the operational amplifier 250 is connected to ground and to the output terminal of the operational amplifier 250 through one or more resistors. What was previously a back capacitive contact, supplied by the chuck, is now provided by the three positioning electrodes 208 located on the periphery of the sensor and which, during the SPV measurements, are connected to the ground 252 rather than to the input terminal of the capacitance (current measuring) preamplifier located on the preamplifier circuit board 58.

To measure capacitance, the electrodes 208 are alternatively switched between the ground 252 and input of the capacitance preamplifier located on preamplifier circuit board 58. This arrangement makes possible non-contact measurements with any type of wafer support. Thus, the wafer support does not need to be connected to ground and could be made of insulating material.

As discussed above, measurements of the surface doping concentration require the formation of an inversion layer at the wafer surface. In one embodiment this is accomplished by charging the wafer 28 using a corona generator and subsequently performing surface photovoltage measurement on the wafer 28. Specifically, the wafer 28 is first charged to inversion with a corona generator. N-type wafers require a negative surface charge and p-type wafers require a positive surface charge. In one embodiment, the corona generator includes a single metal tip, for example tungsten, located 5 mm above the wafer 28 and biased to 3.5 kV for 2 to 3 sec. After charging, the wafer 28 is moved beneath the probe assembly 14 and the measurements performed. After the measurement, the wafer 28 is either moved beneath a neutral charge corona generator or returned to the original corona generator operated in a neutral discharge mode in order to discharge the wafer.

The simple corona generator with the metal tip or wire does not allow for the controlled charging of the wafer surface. The control of charging is important because while there is a minimum charge required to induce an inversion layer at the wafer 28 surface, overcharging may damage the wafer surface, and even cause electrical breakdown of the insulating coating formed on the wafer surface. To avoid overcharging the wafer 28, a closed loop controlled corona charging arrangement, disclosed in FIGS. 6a and 6b, controls the charge deposited on the surface of the wafer and thereby prevents surface damage.

Figure 6B:
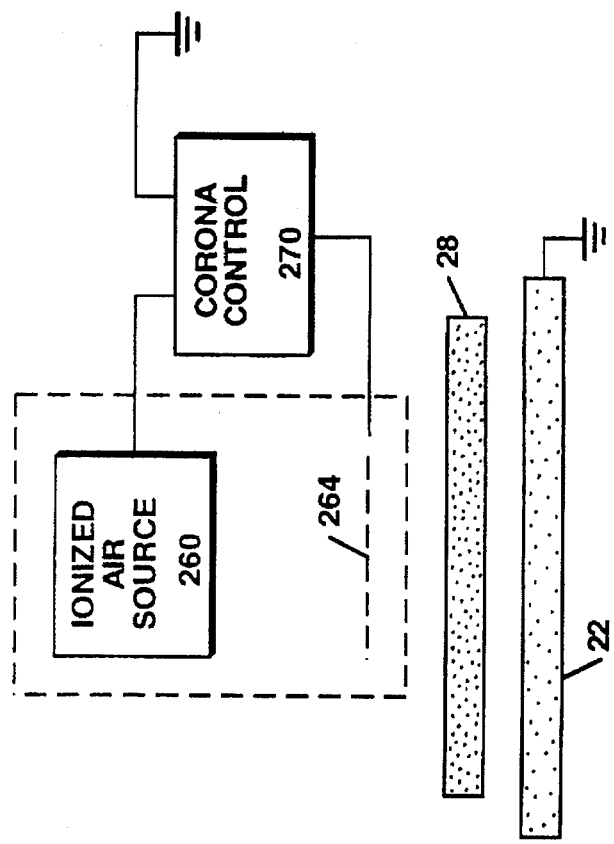
FIG. 6b depicts a block diagram of the corona control circuit of FIG. 6a used to discharge a wafer.
Figure 6A:
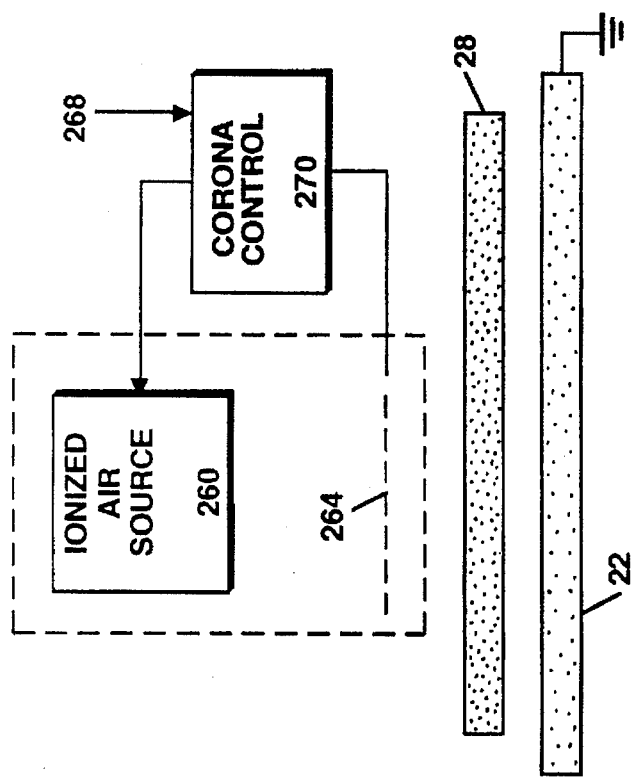
FIG. 6a depicts a block diagram of a corona control circuit used to charge a wafer so as to generate an inversion layer at the wafer surface.

Referring to FIG. 6a, the wafer 28 on the grounded, insulated chuck 22 is moved beneath an ionized air source 260 located about 10 mm above the wafer 28. A mesh, stainless-steel, reference electrode 264 is placed in a distance of about 0.5 mm to 1 mm from the wafer 28. The difference between the potential on the reference electrode 264, $V_{el}$, and a user defined and computer generated reference voltage, $V_{ref}$, 268, termed the differential potential, $V_{diff}$, is amplified and its polarity is reversed within the corona control module 270. This voltage, $V_{corr}$, is applied to the ionized air source 260. Thus, the polarity of the potential applied to the ionized air source 260, $V_{corr}$, by the corona control module 270 is opposite to the polarity of differential voltage and is given by the expression:

$$V_{corr} = V_{ref} - V_{el}$$

Control of the corona charging during the charging process allows not only for real-time control but allows also simpler electronic circuitry to be used. The presence of the ions between ionized air source 260, reference electrode 264, and the wafer 28 lowers the equivalent impedances in the circuity and permits amplifiers to be used (in the control module 270) which have an input impedance of $10_9$–$10^{10}$ ohms. This input impedance is several orders of magnitude lower than in the amplifiers utilized in previous approaches (typically $10^{13}$–$10^{15}$ ohms) when a potential of the wafer surface is measured not during charging but after the turning off of the corona.

Referring to FIG. 6b, the wafer 28 may be discharged by setting the reference voltage 268 to zero, i.e., connecting it to ground. Alternatively, if separate corona units are used for charging and discharging of the wafers, the charging corona reference voltage can be permanently attached to the ground.

Figure 7:
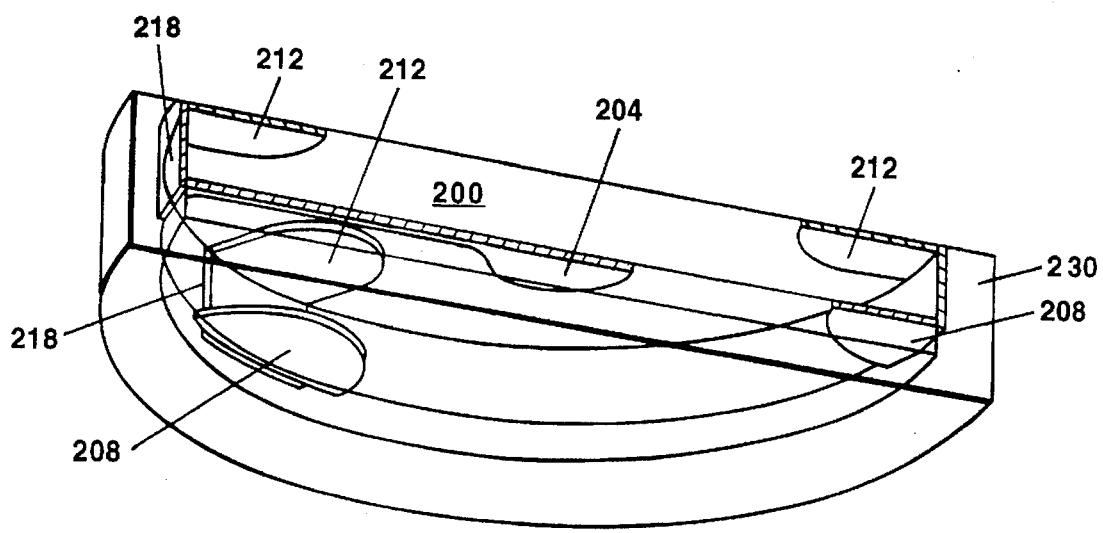
FIG. 7 is a bottom perspective cutaway view of an embodiment of the coated sensor plate of FIG. 4 with a polyimide coating, used with sensor charging and high voltage biasing.
Figure 8:
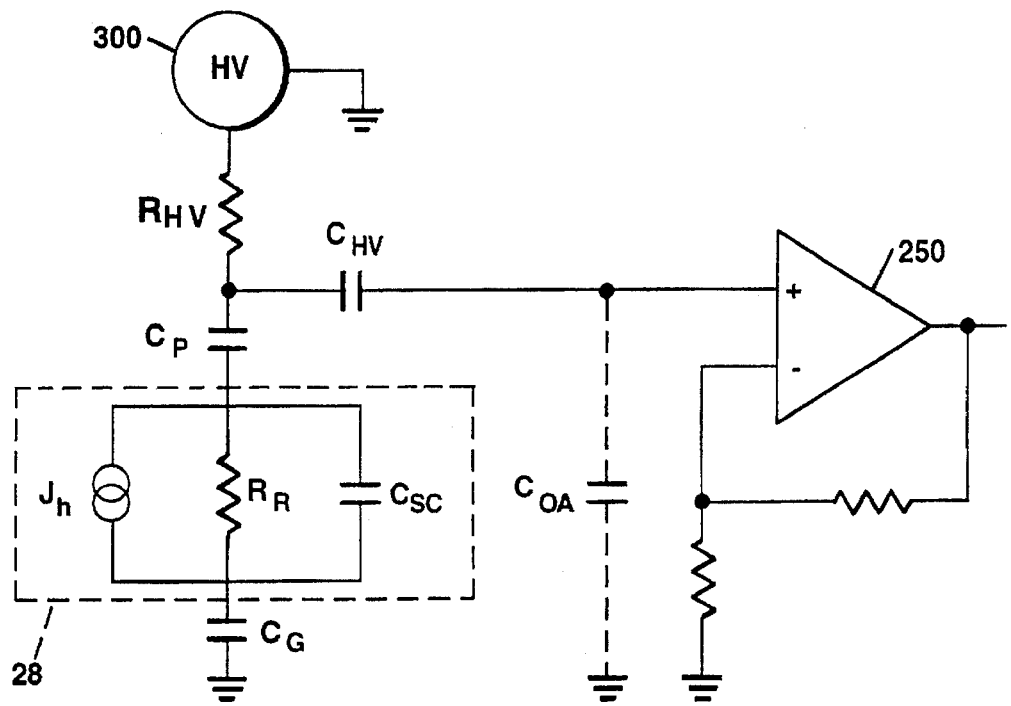
FIG. 8 is a schematic diagram of an embodiment of a preamplifier circuit used for the high voltage biasing of the wafer using the sensor electrodes.

Referring to FIG. 7, an alternative approach to inducing a surface inversion layer is to bias the sensor with a high voltage. Such an approach requires formation of the insulating film 230 such as polyimide over the central electrode 204 and positioning electrodes 208 of the sensor. FIG. 8 depicts this alternative approach to inducing an inversion layer at the surface of the wafer 28 by voltage biasing. FIG. 8 shows a schematic diagram of an electronic circuit that includes a preamplifier for measuring AC surface photovoltage and a connection to a biasing high voltage source used with the sensor having a polyimide coating 230 as just described. The insulating coating 230 of the sensor 54 allows the application of a high enough voltage (500–1000 V) to induce a surface inversion layer in typical wafers used in manufacturing. The arrangement in which a rigid sensor electrode 204 is separated by an air gap from the semiconductor surface requires high degree of flatness of the electrode surface. When such a high DC voltage is used, any edges or surface roughness will increase the local electrical field and enhance ionization of the air resulting in electrical breakdown. Therefore electrical connections between the electrode and the detection electronics are constructed so as to have a minimal effect on the surface flatness. Thus, the use of the side connections 218 eliminates the need to form via holes in the sensor and maintains the high flatness of the sensor. The current in the space charge region of the wafer 28 (indicated in phantom) which is generated by the illumination of the wafer 28 by the LED 64 is depicted as an equivalent current source, $J_{ir}$. An equivalent resistor, $R_R$, which represents the carrier recombination at the surface of the wafer 28 and an equivalent capacitor, $C_{SC}$, which represents the space charge capacitance are also depicted. $C_G$ represents capacitance between the wafer 28 and the chuck 22, while $C_P$ represents capacitance between the sensor electrode 204 and the wafer 28. A computer controllable high voltage 300 is applied through a 10 Mohm resistor, $R_{HV}$, to the sensor electrode 204. The sensor electrode 204 is also connected to the input of the operational amplifier 250 (described previously) through a high voltage capacitor, $C_{HV}$. The capacitance, $C_{OA}$, (also shown in phantom) represents input capacitance of the operational amplifier 250. $C_{HV}$ is selected to be about 10 times larger than $C_{OA}$ so that $C_L$ used in calculating $Im(\delta V_S)$ and $Re(\delta V_S)$ is close to $C_{OA}$. Similarly $R_L$ used in calculating $Im(\delta V_S)$ and $Re(\delta V_S)$ is close to $R_{HV}$.

In addition to the methods just described to form an inversion layer, an inversion layer at the surface of the wafer 28 can be also formed using a chemical treatment. This approach is especially useful for p-type silicon wafers. Since HF introduces positive surface charge, HF treatment will produce a negative inversion layer at the surface of p-type silicon wafers. In one embodiment, the silicon wafer to be tested is subjected to a mixture of hydrofluoric acid and water (1:100 $HF:H_2O$) in a liquid or vapor form. The wafer is then placed beneath the probe assembly 14. In number of processes, HF treatment is already part of the production sequence so that probe assembly 14 needs only to be placed after HF processing location.

It should be noted that the formation of an inversion layer is useful in measuring conductivity type.

Since, in some cases, incoming wafers show acceptor neutralization due to the presence of hydrogen or copper, in order to restore the doping concentration at the surface, the measured wafer is subjected to a high intensity illumination (e.g., using a 250 W halogen light source) after a SPV measurement is made.

Additionally, the present apparatus is particularly adaptable for use in a sealed chamber environment, such as a reduced pressure chamber, a chamber for chemically reactive gasses or a chamber for an inert environment. The entire probe assembly 14 may be positioned within the sealed chamber, with the connections to the electronics passing through the walls of the sealed chamber through pressure fittings. Alternatively, the probe assembly may be mounted in a wall of a sealed chamber such that the sensor is positioned within the chamber but the remainder of the probe assembly is positioned outside of the sealed chamber.

Figure 9:
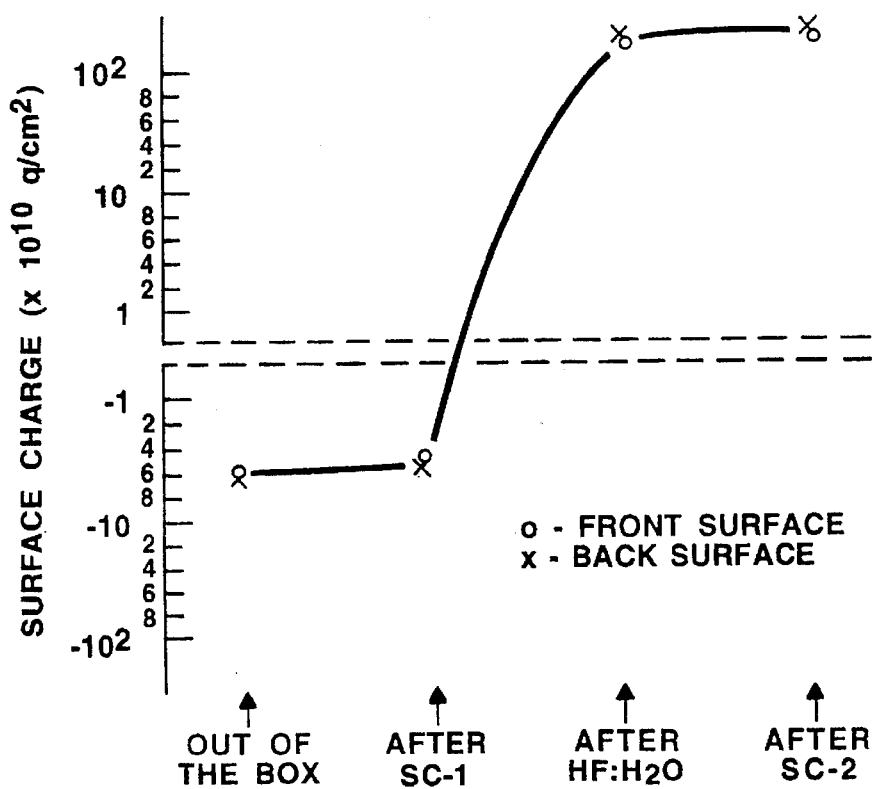
FIG. 9 is a graph of front and back surface charge measurements of a silicon wafer undergoing cleaning.

The approach to process monitoring methodology using an AC-SPV method emphasizes determination of variations of the measured parameters from wafer to wafer rather than value of the specific parameter itself. Typically, measurements of the electrical parameters of the back surface of the wafer are not possible without altering the front surface, which has to be contacted in order to complete a measuring circuit. Hence, measurements performed on the back surface of the wafer are not typically used in process monitoring. The non-contact AC-SPV measurements allows process monitoring by measurement of the surface characteristics on the back surface of the wafer as well as the front surface. As described before, the probe head can be installed underneath the wafer, above the wafer, or otherwise, such that the sensor surface is parallel to the wafer back surface, depending on how the wafer conveying system conveys the wafer to the probe head. In addition, two probe heads can be used, one on each side of the wafer for simultaneous characterization of the front and back side of the wafer. As an illustration of such approach comparison of measurements of the surface charge on the front surface featuring mirror-like finish is shown in FIG. 9. The measurements were performed on the two halves of the same 100 mm, p-type, (100) silicon wafers that were simultaneously subjected to the wet cleaning treatments. At various stages of the cleaning process, the surface charge was measured on the front (polished) surface of one half, and on the back (unpolished) surface of the other half. The results shown in FIG. 9 indicate identical behavior of surface charge on the front and back surfaces.

Having shown the preferred embodiment, those skilled in the art will realize many variations are possible which will still be within the scope and spirit of the claimed invention. Therefore, it is the intention to limit the invention only as indicated by the scope of the following claims.

We claim:

1. An apparatus for the real-time, in-line testing of a semiconductor wafer, having a first surface and a second surface, during semiconductor processing, said apparatus comprising:

a head assembly comprising:
a modulated light source exposing at least a portion of said semiconductor wafer to light of a predetermined wavelength and modulated at a predetermined frequency; and
a voltage sensor comprising a plurality of electrodes positioned adjacent said first surface to detect a surface photovoltage induced at said first surface of said semiconductor wafer in response to said light from said modulated light source without contacting said wafer, said plurality of electrodes sufficient for detecting said surface photovoltage on said first surface; and
a conveying apparatus conveying said wafer adjacent said voltage sensor of said head assembly during said semiconductor processing.

2. The apparatus of claim 1 wherein said wafer and said head assembly are in continuous relative motion during said detection of said surface photovoltage by said voltage sensor.

3. The apparatus of claim 1 wherein said head assembly has a longitudinal axis and the orthogonality of said longitudinal axis of said head assembly with respect to said surface of said wafer is adjustable.

4. The apparatus of claim 3 wherein said orthogonality of said longitudinal axis is adjustable manually by set screws.

5. The apparatus of claim 3 wherein said orthogonality of said longitudinal axis is adjustable automatically by actuators.

6. The apparatus of claim 2 wherein said head assembly is stationary and said wafer is moved continuously relative to said head assembly.

7. The apparatus of claim 6 wherein said conveying apparatus is a conveyor belt.

8. The apparatus of claim 6 wherein said conveying apparatus is a robotic arm.

9. The apparatus of claim 6 wherein said conveying apparatus is a wafer chuck.

10. The apparatus of claim 9 wherein said wafer chuck is insulated from said wafer and is grounded.

11. The apparatus of claim 6 wherein said conveying apparatus conveys said wafer beneath said voltage sensor of said head assembly.

12. The apparatus of claim 1 wherein said conveying apparatus is biased by a DC voltage.

13. The apparatus of claim 12 wherein said bias DC voltage is substantially between −1000 and 1000 volts.

14. The apparatus of claim 1 wherein said conveying apparatus conveys said wafer above said voltage sensor of said head assembly.

15. The apparatus of claim 1 further comprising:
a light splitting device positioned between said modulated light source and said wafer, said light splitting device passing a first portion of said modulated light from said modulated light source onto said wafer; and
a position photodiode positioned to receive light reflected by said wafer and reflected by said light splitting device,
said position photodiode producing a location signal in response to said wafer reflecting said modulated light.

16. The apparatus of claim 15 wherein said light splitting device is a beam splitter.

17. The apparatus of claim 15 wherein said position photodiode detects the edge of said wafer by said reflected light and said voltage sensor measures said surface photovoltage in response to said location signal.

18. The apparatus of claim 15 further comprising a collimating lens collimating said modulated light from said modulated light source.

19. The apparatus of claim 18 wherein said collimating lens is positioned between said modulated light source and said light splitting device.

20. The apparatus of claim 1 further comprising:
a position sensor providing electrical signals in response to the position of said head assembly relative to said wafer; and
a head assembly positioner moving said head assembly toward and away from said wafer in response to electrical signals received from said position sensor indicating the position of said head assembly relative to said wafer.

21. The apparatus of claim 20 wherein said position sensor comprises at least one position electrode and said surface photovoltage sensor comprises a surface photovoltage electrode in electrical communication with a surface photovoltage preamplifier.

22. The apparatus of claim 21 wherein said surface photovoltage electrode is connected to said surface photovoltage preamplifier by at least one flexible contact.

23. The apparatus of claim 21 wherein an approximately 70 kHz signal is supplied to said at least one position electrode.

24. The apparatus of claim 1 wherein said modulated light source is a light emitting diode (LED).

25. The apparatus of claim 24 wherein said modulated light source is modulated at approximately 40 kHz.

26. The apparatus of claim 21 further comprising:
an insulator having a first side and a second side and at least one side wall connecting said first side and said second side,
wherein said surface photovoltage electrode is deposited upon the first side of said insulator.

27. The apparatus of claim 26 wherein a contact electrode is deposited on said second side of said insulator, said contact electrode in electrical communication with said surface photovoltage electrode by conductors deposited on said side wall between said contact electrode and said surface photovoltage electrode.

28. The apparatus of claim 26 wherein said surface photovoltage electrode is covered with a thin insulated coating.

29. The apparatus of claim 28 wherein said thin insulating coating is thinner than the distance between the voltage electrode and said wafer during said detection of said surface photovoltage.

30. The apparatus of claim 21 further comprising:
an insulator having a first side and a second side and at least one side wall connecting said first side and said second side,
wherein said at least one position electrode is deposited upon said first side of said insulator.

31. The apparatus of claim 30 wherein at least one contact electrode is deposited on said second side of said insulator, said at least one contact electrode in electrical communication with a respective one of said at least one position electrode by conductors deposited on said side wall between each said at least one contact electrode and said respective one of said at least one position electrode.

32. The apparatus of claim 30 wherein said at least one position electrode is covered with a thin insulated coating.

33. The apparatus of claim 20 further comprising:
a computer comprising a data acquisition circuit and a position control circuit;
a position measuring circuit in electrical communication with said data acquisition circuit and in electrical communication with said position sensor; and
a surface photovoltage measuring circuit in electrical communication with said data acquisition circuit, in electrical communication with said modulated light source and in electrical communication with said surface photovoltage sensor,
said head assembly positioner moving said head assembly toward and away from said wafer in response to signals from said position control circuit, generated in response to said signal from said position measuring circuit,
said computer determining electrical characteristics of said wafer in response to said signals acquired by said data acquisition circuit from said surface photovoltage measuring circuit.

34. The apparatus of claim 33 wherein said position measuring circuit comprises:
a lock-in amplifier having an input terminal, a reference terminal and an output terminal; and
an oscillator in electrical communication with said position sensor and in electrical communication with said reference terminal of said lock-in amplifier,
said position sensor in electrical communication with said input terminal of said lock-in amplifier,
said output terminal of said lock-in amplifier in electrical communication with said data acquisition circuit.

35. The apparatus of claim 33 wherein said surface photovoltage measuring circuit comprises:
a lock-in amplifier having an input terminal, a reference terminal and an output terminal; and an oscillator in electrical communication with said modulated light source and in electrical communication with said reference terminal of said lock-in amplifier, said voltage sensor in electrical communication with said input terminal of said lock-in amplifier;

said output terminal of said lock-in amplifier in electrical communication with said data acquisition circuit.

36. The apparatus of claim 35 wherein said surface photovoltage measuring circuit further comprises said position sensor in electrical communication with electrical ground.

37. The apparatus of claim 1 further comprising a corona source charging said wafer to form an inversion layer prior to moving said wafer adjacent said surface photovoltage sensor.

38. The apparatus of claim 37 wherein said corona source comprises a control loop to prevent the overcharging of said wafer.

39. The apparatus of claim 37 further comprising a charge neutralizing device for discharging said wafer after said voltage sensor has measured said surface photovoltage.

* * * * *